United States Patent [19]
Kocon

[11] Patent Number: 5,970,343
[45] Date of Patent: Oct. 19, 1999

[54] FABRICATION OF CONDUCTIVITY ENHANCED MOS-GATED SEMICONDUCTOR DEVICES

[75] Inventor: Christopher Boguslaw Kocon, Plains, Pa.

[73] Assignee: Harris Corp., Melbourne, Fla.

[21] Appl. No.: 09/133,030

[22] Filed: Aug. 12, 1998

[51] Int. Cl.$^6$ ............................................ H01L 21/336
[52] U.S. Cl. ..................... 438/268; 438/138; 438/206; 438/209; 438/212; 438/526; 438/554
[58] Field of Search ..................................... 438/206, 209, 438/212, 268, 526, 554, 133, 135, 138, FOR 160, FOR 172, FOR 156, FOR 316, FOR 236

Primary Examiner—Teresa M. Arroyo
Assistant Examiner—Long Pham
Attorney, Agent, or Firm—Henry I Schanzer

[57] ABSTRACT

In the manufacture of an MOS gated semiconductor device, indentations are provided on a surface of a semiconductor wafer extending inwardly of respective spaced apart regions at the wafer surface having doping concentrations greater than that present in the remainder of the wafer. A layer of silicon having a doping concentration less than that of the substrate is conformally provided on the substrate surface whereby the indentations in the substrate surface are replicated on the surface of the silicon layer. Dopants in the substrate regions are then out-diffused into the silicon layer to provide highly doped buried regions within the layer. Then, using the silicon layer surface indentations as photomask alignment marks, gate electrode structures are formed on and within the silicon layer in preselected orientation relative to the buried regions. The buried regions provide low resistance paths for current through the resulting devices.

5 Claims, 4 Drawing Sheets

FABRICATION OF CONDUCTIVITY ENHANCED MOS-GATED SEMICONDUCTOR DEVICES

BACKGROUND OF THE INVENTION

This invention relates to semiconductor devices of the MOS-Gated type and, particularly, to a method of fabricating such devices with improved electrical conductivity.

By "MOS-gated" type is meant semiconductor devices including a gate control structure comprising a gate electrode overlying, but dielectrically isolated from, a first surface of a semiconductor substrate including, at the surface, source and drain regions separated by a channel region. Operation of the devices is under control of voltages applied to the gate electrode for controlling the conductivity of a path for current through the channel region between the source and drain regions. While a number of different types of MOS-gated devices now exist, e.g., insulated gate bipolar transistors (IGBTs) and MOS controlled thyristors (MCTs), and while the present invention can be used in all such devices, the greatest utility of the invention is in "unipolar" devices, particularly, metal-oxide-semiconductor field-effect transistors (MOSFETs). In such unipolar devices, only one type of majority charge carriers (holes or electrons) is present, and the resistivity of the device semiconductor material is relevant to device performance. As described hereinafter, the use of the invention enables the use of higher conductivity devices.

Additionally, the invention has greatest utility in devices where the drain region extends to the substrate first surface for being disposed between oppositely disposed channel "regions" (which may be part of a common annular channel region), and where the drain region voltage is applied to the drain region at a position beneath the channel region(s). The portion of the drain region adjacent to the substrate first surface and between the oppositely disposed channel regions is referred to as the drain "neck".

Avalanche breakdown in semiconductor devices is well-known and occurs when charge carriers arriving at a reverse biased p-n junction are accelerated by the field in the junction depletion region and receive enough energy so that, in collisions with the substrate lattice, the charge carriers ionize electrons and holes which repeat the process and lead to large current flow across the otherwise reverse biased junction. The reversed biased junction of concern to the present invention is the p-n junction between the channel region and the drain region which must withstand the voltage difference between the device source and drain regions when the device is in its current non-conducting, voltage blocking (off) condition.

In general, higher avalanche breakdown capability is provided by the use of higher resistivity (lower doped) semiconductor materials adjoining the p-n junction. A problem with this, however, is that the higher the resistivity of the semiconductor material, particularly in unipolar devices where the current density is generally not sufficiently high for "conductivity modulating" the resistivity of the material (in effect, negating it), the higher are the voltage drop across the device and the $I^2R$ heating of the device. Preferably, such parameters should be as low as possible and the present invention is directed to this goal.

SUMMARY OF THE INVENTION

Typically, as described hereafter, certain portions of the drain region of MOS devices spaced away from where the drain region directly adjoins the channel region p-n junction "support" little or any of the reverse biasing voltage applied across the p-n junction. In accordance with this invention, such drain portions are made to have higher conductivity than is normally present in known devices. This is accomplished, as hereinafter described, by a controlled out-diffusion process wherein regions of dopants provided in a substrate are used both for providing higher conductivity in selected portions of the drain regions and for providing alignment indicia for successive processing steps.

DESCRIPTION OF THE DRAWINGS

The drawings are schematic and not to scale.

DESCRIPTION OF PREFERRED EMBODIMENTS

Figure 1:
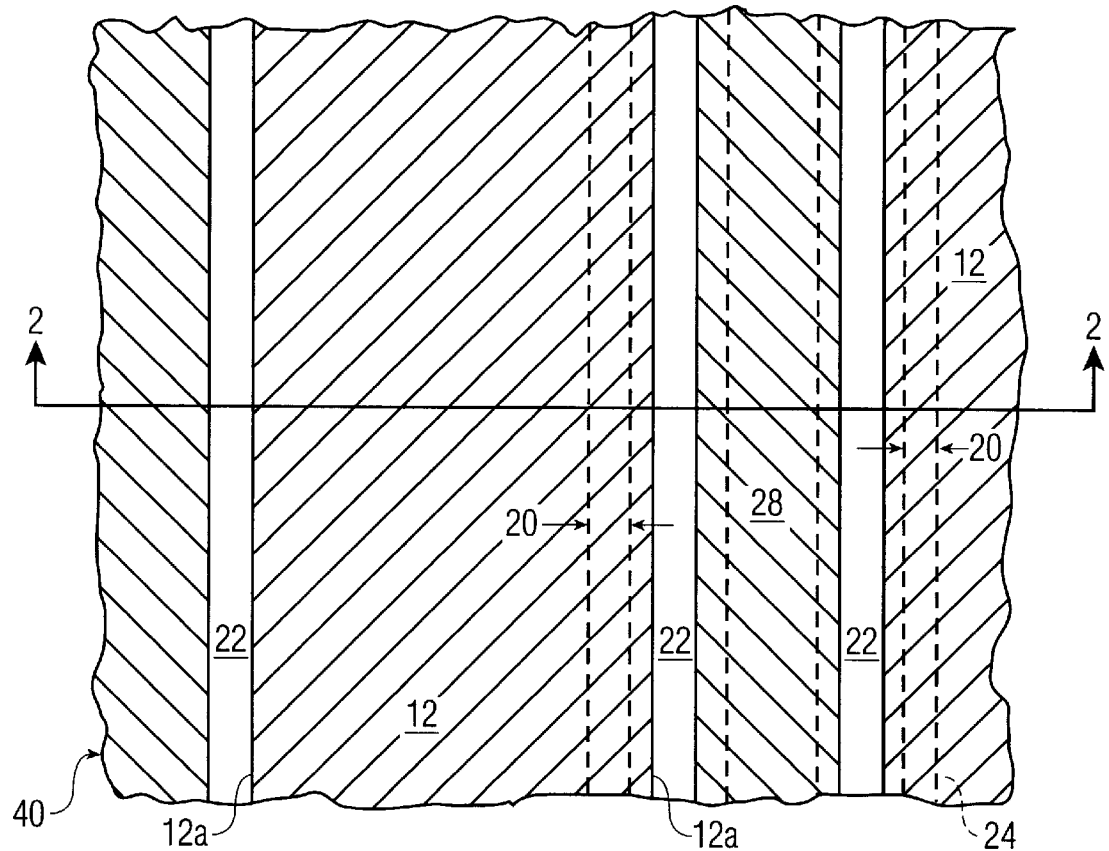
FIG. 1 is a plan view of a portion of a substrate of a known MOSFET type semiconductor device.

As previously described, the invention has principal (but not exclusive) utility in unipolar power devices of the MOSFET type. Although structural details vary from device to device, in power devices it is common to provide a plurality of identical gate electrode structures in parallel, side-by-side relationship over the surface of a semiconductor wafer. In the embodiment shown in FIGS. 1 and 2, a single gate electrode structure 10, and portions of adjacent such gate structures are shown; each such gate electrode structure 10 comprising an elongated (FIG. 1) gate electrode 12 of conductive material, e.g., doped polycrystalline silicon, spaced apart (FIG. 2) from a surface 14 of a semiconductor substrate 24–24a, e.g., of silicon, by a relatively thin layer 18 of insulating material, e.g., silicon dioxide (referred to as the "gate oxide layer"). The gate electrode 12 directly overlies (along each side of the gate electrode 12) a channel region 20 of one conductivity type, p type in this example, disposed between a source region 22 and a drain region 24. The source and drain regions are of a conductivity type opposite to that of the channel region 20, and are of n type in this embodiment. The gate electrode 12 extends over the source 22 and drain 24 regions.

Figure 2:
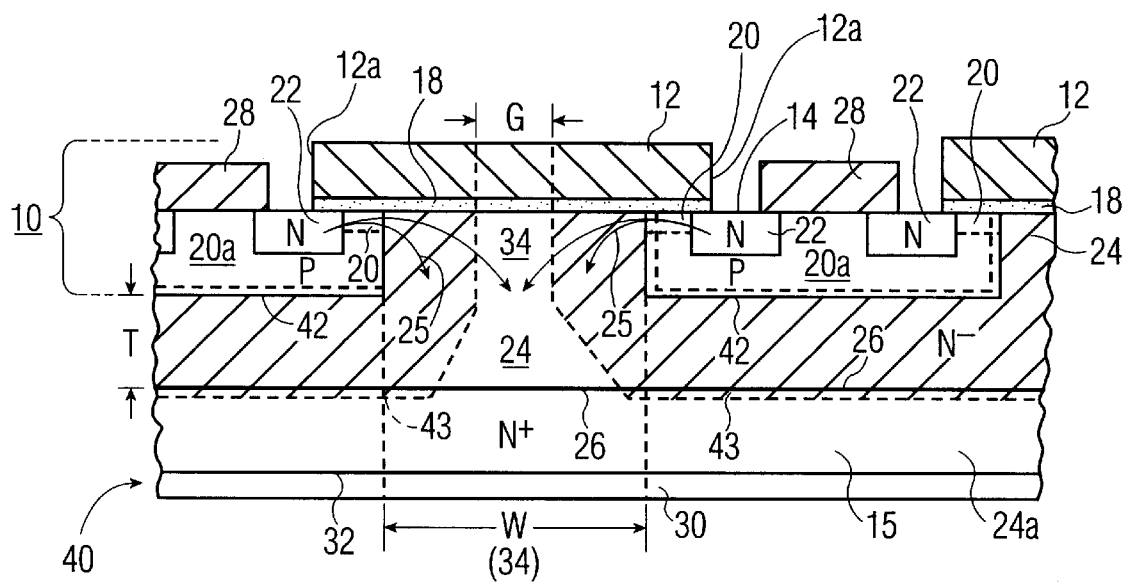
FIG. 2 is a section taken along line 2—2 of FIG. 1.

Electrical connections are provided for applying voltages to various parts of the devices and different arrangements are used depending upon the particular device structure. In one common arrangement, in which the invention has particular utility, the channel region 20 is part of a larger "body" region 20a in which is disposed the source region 22. (As shown in FIG. 2, each body region 20 includes two spaced apart source regions 22 each defining a respective channel region 20 controlled by a respective gate electrode 12.) A common electrical connection is made to the source 22 and body 20a regions by means of a layer 28 of metal referred to as the source electrode.

The body region 20a, in which is disposed the two channel regions 20, is referred to as a "well" formed within the drain region 24 which completely surrounds the various body regions 20a within the substrate. The drain region 24 extends downwardly below the body regions 20a and adjoins an underlying portion 24a of the substrate 24–24a. The portion 24a, which adjoins the drain region 24 at an interface 26, forms an extension of the drain region 24 as hereinafter explained. The portion 24a is electrically connected to a metal electrode 30 on a surface 32 of the portion 24a opposite to the surface 14. The drain region 24 extends upwardly between adjacent body regions 20a to the substrate surface 14. Each upwardly extending portion 34 of the drain region is referred to as the drain "neck". Herein, in the side-by-side strip geometry shown in FIG. 1, the necks 34 comprise rectangular strips underlying each respective gate electrode. In geometries (not shown) where the two side-by-side body regions 20a shown in FIG. 2 are part of a single annular body region, each drain neck comprises an upwardly extending, solid circular cylinder.

In other MOS-gated devices, the drain region 24 (including the portion 24a) is connected to the underlying electrode 30 through one or more intervening doped regions, as generally known. As mentioned, a typical discrete MOS-gated power device comprises a plurality of parallel connected gate electrode structures 10 of the type shown in FIGS. 1 and 2 disposed in side-by-side relation over the substrate 24,24a. The drain region 24 extends beneath and is common to all the gate electrode structures.

FIG. 2 indicates how the device 40 (as well as other MOS-gated devices) operates both in the conductive, "on" state, and in the voltage blocking, "off" state. In the "on" state, charge carriers flow through each channel region 20 between the source 22 and drain 24 regions under the control of voltages applied to the gate electrode 12 relative to the source region 22. In the herein illustrated device 40 having a p-type channel region 20 disposed between n-type source 22 and drain regions 24, a positive voltage is applied to the gate electrode 12 for attracting electrons towards the surface of the channel region. The thus attracted electrons, when of sufficient concentration, invert the conductivity type of a narrow portion of the p-type channel region adjacent to the substrate surface 14 to n-type for establishing a continuous path of n-type conductivity from the source region 22 through the channel region 20 to the drain region. Current (electrons) flows through the n-type channel when a positive voltage is applied to the drain region 24 relative to the source region 22. The current enters the drain region 24 near the top surface 14 of the substrate and then flows (as indicated by the arrows 25 in FIG. 2) downwardly through the drain region layer 24 to the underlying drain region layer 24a of quite high conductivity. The drain region layer 24 is of relatively low conductivity and electrical losses occur thereon.

In the absence of a conductivity type inverting voltage on the gate electrode, a current path is not established through the channel region 20 and the device is in its off-state. If the voltage on the drain region 24 is positive while the device is off, the p-n junction 42 between the n-type drain region 24 and the p-type body region 20a is reverse biased, and the voltage difference between the drain region 24 and the source region 22 appears across the reverse biased junction 42. A depletion region 43 (shown shaded in FIG. 2) adjoins each p-n junction 42. In FIG. 2, the depletion region 43 is shown in the condition when the device is undergoing avalanche breakdown. The avalanching condition is further discussed hereinafter.

The device 40 is designed to withstand a certain rated source to drain voltage when the device is in its off-condition and, to this end, the dimensions and doping profiles of the device regions are selected in accordance with well known design parameters for avoiding avalanche breakdown of the reverse biased junction 42 for applied voltages less than the device rated voltage. Avalanche breakdown is now well understood and, in general, avalanche breakdown is avoided by the use of low doping levels in those portions of the drain region 24 where it forms the p-n junction 42 with the body region 20a. How the doping levels are selected is described hereinafter.

Relevant to the present invention is how the device shown in FIGS. 1 and 2 is fabricated. This is now described in connection with FIGS. 3 through 5. In these figures, only portions of the device 40 shown in FIGS. 1 and 2 are illustrated.

The starting workpiece (FIG. 3) comprises a silicon precursor substrate 24a of uniformly high (e.g, n+) conductivity on which has been deposited a uniformly lightly doped (n⁻) epitaxial layer 24. The dopants present in the layer 24, as deposited, are referred to as "background" dopants. The layer 24 also forms the aforementioned drain region 24. As described hereinafter, the doping concentrations vary within the drain region and are a function of the "background" doping concentration (i.e., the doping present in the layer 24 as it is epitaxially grown) modified by dopants later added to the drain region, e.g., by known ion implantation and subsequent diffusion. As initially provided, the precursor substrate 24a is doped with phosphorous or arsenic at a uniform concentration of $2 \times 10^{19}$ atoms/cm³, and the layer 24 is doped with phosphorous at a uniform concentration of $2.8 \times 10^{16}$ atoms/cm³.

A thin gate oxide layer 18 (e.g., silicon dioxide) overlies the surface of the layer 18 and an electrically conductive material layer 12 (e.g., heavily doped polycrystaline silicon) overlies the gate oxide layer 18. Then (FIG. 4), the upper layers 12 and 18 are patterned (by photolithography) into a plurality of side-by-side elongated gate electrodes 12, only of one of which is shown in FIGS. 1 and 2. Of importance, as is hereafter further discussed, is that the accuracy required in the alignment of the photomask used to define the various gate electrodes 12 on the substrate layer 24 is relatively low. This is because, at the time of patterning the upper layers 12 and 18, the underlying layer 24 is "featureless" in that it is everywhere uniformly doped. Conversely, once the gate electrodes are in place, an advantage of a known self-alignment process now to be performed is the extremely high precision obtainable.

The next step (FIG. 4) is to ion implant p type dopants (e.g. boron) into the substrate layer 24 where the substrate surface 14 is exposed by the gate electrode 12. The edge 46 of the two regions 20c (shown by dash lines in FIG. 4) where the ions are implanted is precisely defined by the edges 48 of the gate electrode 12. Then, in a precisely controlled heating step, the implanted impurities are caused to diffuse both downwardly and laterally within the substrate layer 24 for moving the region edges 46 to the positions shown at 42 (the aforementioned p-n junction) beneath the gate electrode 12. As known, when two dopants are present within any region of a semiconductor device, the conductivity type of the region is that of the dopant of the higher concentration, and the actual electrical conductivity of the region is determined by the net difference of concentrations of the two dopants. The p-n junction 42 between the diffused p type region 20a (the aforementioned p well) and the underlying n type region 24 is where the concentrations of both types of dopants are equal. In portions of the n type region 24 adjoining the p-n junction 42, p type dopants are present, but at a concentration less than the n type background dopants present and at decreasing concentrations with distance away from the p-n junction 42.

Figure 5:
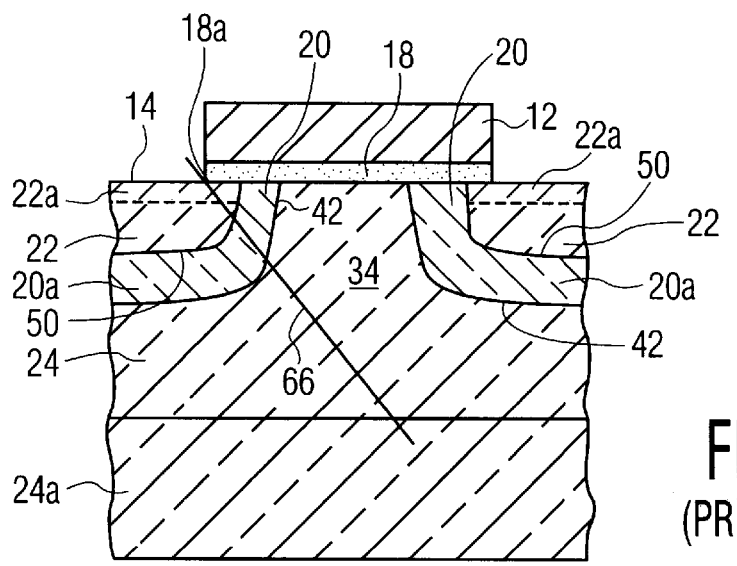

After the formation of the diffused p type region 20a, n type dopants (e.g. phosphorous) are then implanted (FIG. 5)

into the p regions 20a again using the gate electrode as a mask for precisely positioning the edges of the thus formed implanted n regions. The concentration of the newly implanted n type dopants added to the n type dopants originally present in the layer 24 greatly exceeds the concentration of the previously implanted p type dopants for providing two n type regions 22a shown by dash lines in FIG. 5.

The regions 22a are then precisely diffused laterally and downwardly within their respective p regions 20a to provide the aforementioned source regions 22 extending beneath the gate electrode 12 and forming p-n junctions 50 with the p regions 20a. The portions 20 of the p regions 20a adjacent to the surface 14 of the substrate between the p-n junctions 42 and 50 are the aforementioned channel regions.

As previously explained, FIG. 2 shows a condition where the device is undergoing avalanche breakdown and illustrates the depletion region then present owing to the reverse biasing of the p-n junction 42.

As known, the electric field intensity within a depletion region is a function of the number of net fixed charges encompassed by the depletion region, and when the maximum field intensity (at the p-n junction) reaches a critical amplitude (associated with a critical number of net fixed charges) avalanche breakdown occurs. The device 40 is designed such that for the particular doping and width of the layer 24, the critical electric field intensity is not reached, and avalanching does not occur, until the depletion regions 43 extend entirely across the width of the layer 24 and penetrate into the highly doped layer 24a. A reason for such design is that the thickness and doping of the layer 24 are parameters which can be controlled during device manufacture, hence, devices having preselected avalanche breakdown ratings can be reliably manufactured.

Once the depletion regions 43 begin to penetrate the highly doped drain layer 24a, the electric field intensity rapidly rises to the critical level at which avalanching occurs (such condition being illustrated, as mentioned, in FIG. 2). This condition is now further discussed.

In general, the width dimensions of the gate electrode structure 10 (i.e. the left-to-right dimensions in FIG. 2) are made as small as possible; the smaller the width dimension, the better control being obtained over the turn-on and turn-off of the current through the device. While FIG. 2 is not to scale, the fact is that, as illustrated, the thickness T of the portion of the drain layer 24 disposed between the p-n junction 42 and the drain layer 24a is significantly less than the width W of the neck region 34 between the two spaced apart body regions 20a.

In a typical device, for example, the thickness T is around ½ the width dimension W. The result of this (shown schematically) is that when the depletion regions 43 are at their maximum widths at the on-set of avalanching, the two depletion regions 43 extending laterally towards one another across the drain neck 34 do not meet, but are spaced apart by a gap G.

Because the entire voltage difference between the source and drain regions occurs across the width of the depletion regions 43, no voltage drop occurs within the gap portion G of the drain neck 34, and the dimension and conductivity parameters of the gap portion G have no influence upon the avalanche capability of the device.

Conversely, as shown by the arrows 25 in FIG. 2, during the on-state of the device, when electrons are flowing through the channel region 20 into the drain region 24, some of the paths of current are through the neck portion G, and the electrical conductivity through the neck portion G affects the voltage drop across, and the $I^2R$ loss within, the device. Accordingly, and as recognized by the inventor herein, by increasing the conductivity of the portion G of the neck region 34 independently of the conductivity (doping) of the portions of the neck region 34 within the depletion region 43 at the onset of avalanching, improved efficiency of current conduction through the device (lower voltage and $I^2R$ loses) can be obtained while not affecting the avalanching rating of the device.

Figure 11:
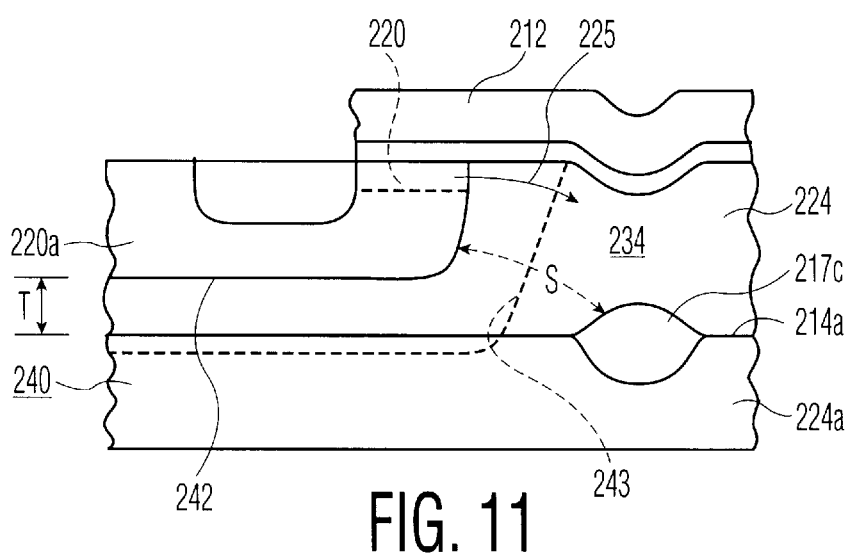

In my co-pending application entitled, "CONDUCTIVITY ENHANCED MOS-GATED SEMICONDUCTOR DEVICES", Ser. No. 09/114,769, filed Jul. 14, 1998, there is disclosed devices wherein substantially the entire neck portions are of a higher conductivity than present in prior art MOS-gated devices. According to the present invention, however, only a buried region (FIG. 11, 217c) of the neck portion has high conductivity. How this is accomplished is now described.

Figure 6:
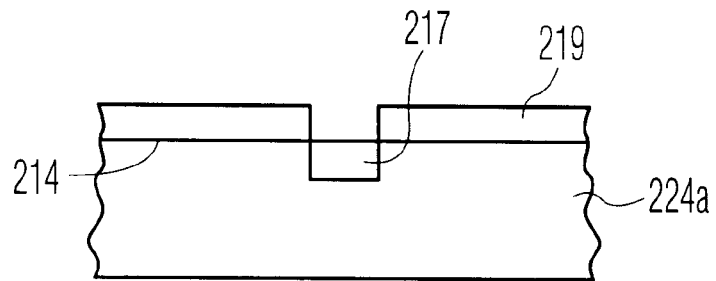
FIGS. 6–11 are views similar to FIGS. 3–5 but illustrating the fabrication of a device made according to the present invention.

Starting (FIG. 6) with a heavily uniformly doped (n+) substrate 224a (e.g., at $2 \times 10^{19}$ atoms/cm$^3$) on which an epitaxial layer has not yet been deposited, a plurality of regions 217 (only one shown) of even heavier doping are provided. The regions 217 can be provided using known processes, e.g., ion implantation (of phosphorous or arsenic, at a concentration of $4 \times 10^{15}$ atoms/cm$^2$, to a depth of 0.03–0.07 μm) through a patterned masking layer 219 covering a surface 214 of the substrate 224a.

Figure 7:
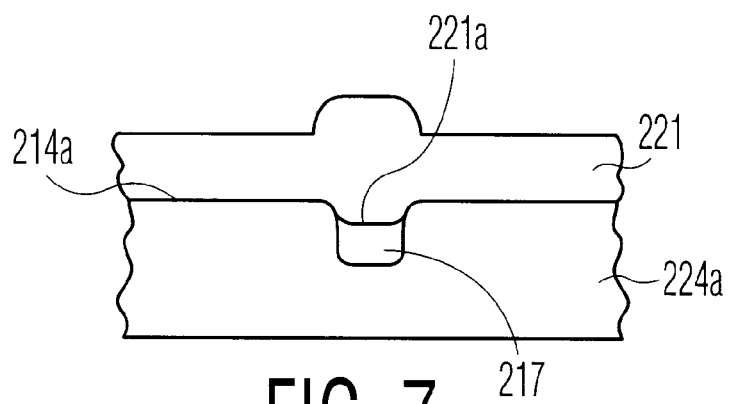
Figure 8:
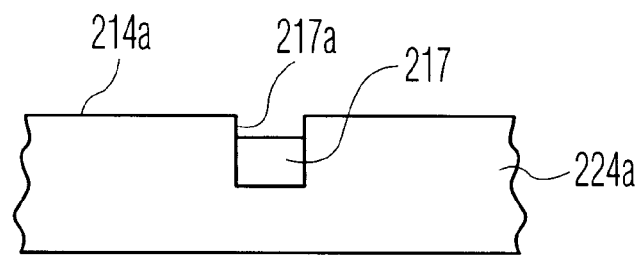

The layer 219 is then removed, and (FIG. 7) a layer 221 of silicon dioxide is thermally grown on the surface of the substrate 224a (the surface thereof now being designated 214a). One effect of such thermal growth process, as known, is repairing ("annealing") surface damage caused by the previous doping process. Another effect is that, owing to the pattern of extra heavily doped regions 217 along the surface 214a of the substrate 224a, a visible topographical pattern is formed on the substrate surface 214a. The visible pattern results from the known fact that the rate of growth of a thermally grown silicon dioxide layer, involving the oxidation of the silicon at the substrate surface, is a function of the concentration of the dopants at the surface. Thus, as shown in FIG. 7, the oxide layer 221 grows most rapidly at the extra heavily doped portions 217 whereby the oxide layer 221 forms plugs 221a which extend into the substrate 224a at the portions 217. (As shown, the upper surface of the oxide layer 221 is also topographically patterned, but this is only incidental to the process because the oxide layer 221 is thereafter removed.) The result of removing the oxide layer 221 (e.g., using a known silicon dioxide etchant) is shown in FIG. 8. Because the oxide layer 221 (FIG. 7) had penetrated the substrate 224a most deeply at the portion 217, removal of the oxide layer 221 and the plugs 221a results in a pattern of surface indentations 217a in the newly exposed substrate surface 214a. These surface indentations 217a are to be preserved in the workpiece to serve as alignment marks for subsequent photomasking processes to be performed.

The next step (FIG. 9) is to grow an n doped epitaxial layer 224 on the n-type substrate 224a. The doping concentration of the layer 224 is in accordance with prior art practice. That is, the layer 224 is of relatively low conductivity (n−) for providing (precisely as in the prior art device 40) a low conductivity drain region for reverse biasing voltage capability. The epitaxial layer 224 reproduces the contour of the surface 214a (FIG. 8) of the substrate 224a, hence, indentations 217b (FIG. 9) corresponding to the indentations 217a on the substrate surface 214a are reproduced on the surface 225 of the layer 224. Additionally, because the epitaxial layer growth process is done at an elevated temperature, diffusions of the various dopants in the workpiece occur. Here, dopants from the n⁺ substrate 224a diffuse upwardly into the layer 224 and the dopants in the extra heavily doped portions 217 of the substrate 224a diffuse both upwardly into the layer 224 and downwardly in the substrate 224a. "Buried" regions 217c of high conductivity are thus provided at the interface 214a between the substrate 224a and the layer 224.

Each buried region 217c, of higher conductivity than the surrounding layer 224, is disposed directly beneath a corresponding indentation 217b in the surface 225 of the epitaxial layer 224. Additionally, each buried region 217c extends partially vertically through the layer 224 towards the surface 225 of the layer 224. The height of the buried region 217c relative to the thickness of the layer 224 is a function, as will be understood by workers in the field, of the width and doping concentrations of the regions 217 and the various thermal processes used. Such height is also, as known, a function of the rate of diffusion of the dopants present. Phosphorous, for example, diffuses, in silicon, more rapidly than arsenic. Hence, if the substrate 224a is uniformly doped with arsenic, and the portions 217 (FIG. 6) are doped with phosphorous, the height of the buried regions 217c within the layer 224 will be further increased owing to the rapid rate of diffusion of the phosphorous.

Figure 3:
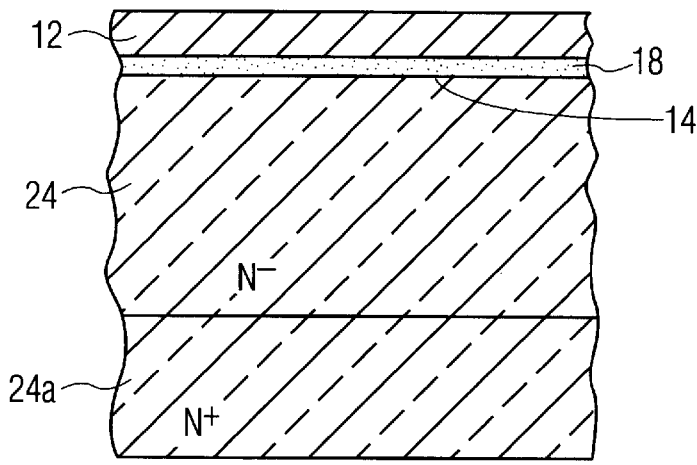
FIGS. 3–5 are views, in section, of a portion of a semiconductor workpiece at successive stages in the fabrication of the device shown in FIGS. 1 and 2.
Figure 4:
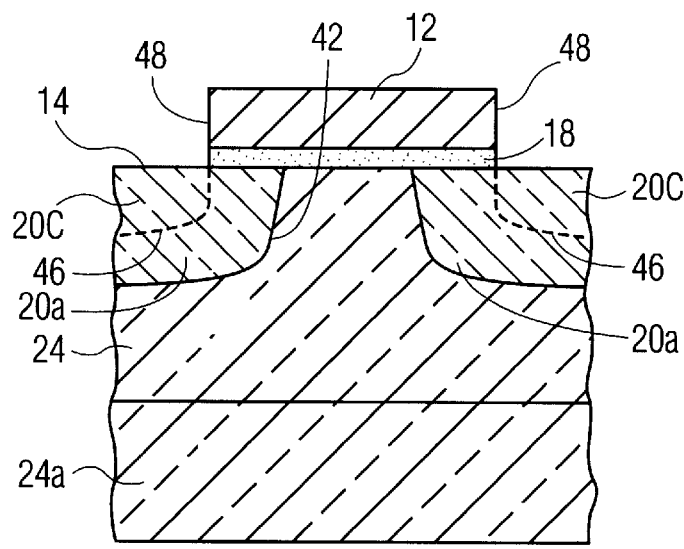
Figure 9:
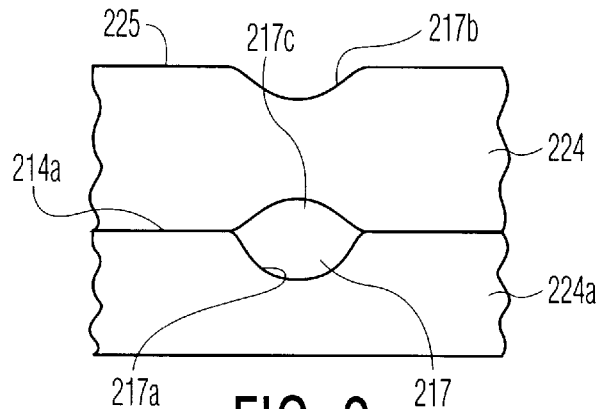
Figure 10:
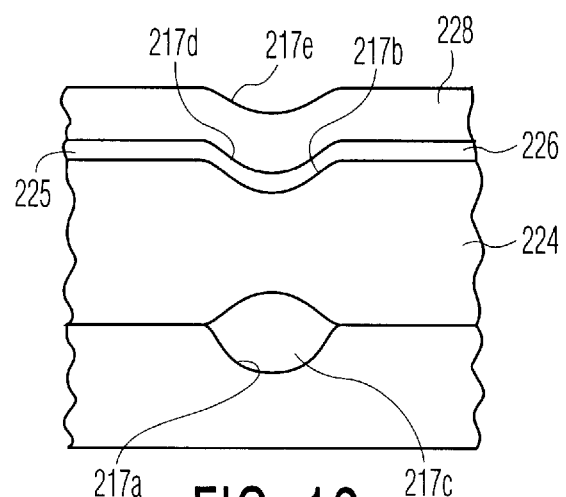

With the workpiece in the condition shown in FIG. 9, a device can then be completed using, for example, the exact same processes illustrated in FIGS. 3–4 in connection with the fabrication of the prior art device 40 shown in FIG. 5. One exception is that whereas, as described in connection with FIGS. 3 and 4, the prior art device gate electrode 12 is formed on a "featureless" substrate 24a, gate electrodes 212 (FIG. 11) to be formed on the workpiece shown in FIG. 9 are carefully aligned with the buried regions 217c within the layer 224. Such alignments can be done in known manner involving the use of a photomask for defining a pattern of gate electrodes 212 each overlying and centered on a corresponding buried region 217c. In the process, a layer 226 (FIG. 10) of a gate oxide is first formed on the surface 225 of the layer 224 followed by a layer 228 of a gate electrode material, e.g., doped polysilicon as used in the prior art device 40 shown in FIGS. 1 and 2. Significantly, both layers 226 and 228 reproduce the patterns of (FIG. 9) indentations 217b on the surface 225 as (FIG. 10) indentations 217d and 217e, respectively. Then, the photomask (not shown) used for defining the gate electrode structures is aligned with the indentations 217e for precisely aligning the to-be-formed electrode structures with the previously defined buried regions 217c.

The resulting device 240 (FIG. 11) is similar (in this embodiment) to the prior art device shown in FIG. 5, except that the drain neck portion 234 overlies a region 217c projecting upwardly from the bottom of the layer 224. The region 217c has a higher electrical conductivity than the remainder of the uniformly doped n⁻ layer 224. The higher conductivity of the upwardly projecting region 217c provides a relatively low electrical resistance path 225 for current passing into the device drain region 224 (through a channel region 220) to the underlying substrate 224a of n⁺ conductivity. Significantly, however, the higher conductivity region 217c is disposed outside of the depletion region present (shown by dashed line 243) when the device is maximally (according to its rating) reverse biased. (In FIG. 11, the distance T between the p-n junction 242 and the interface 214a is shown greater than the smallest distance S between the p-n junction 242 and the buried region 217c.) Accordingly, the avalanching withstanding capability of the device is unaffected by the presence of the high conductivity region(s) 217c which, however, are effective for reducing the resistance to current flow through the device.

What is claimed is:

1. A method of fabricating an MOS gated semiconductor device comprising the steps of:

providing, at a surface (214) on a first side of a silicon substrate (224a) having a first concentration of a first conductivity (N) type of dopants therein, a first region (217) having a second concentration of first conductivity type dopants higher than said first concentration, forming a first indentation (217a) in a surface (214a) on said first side of said silicon substrate extending into said first region, depositing a layer 224 of silicon having a third concentration of first conductivity type dopants less than said first concentration on said first side of said silicon substrate and into said first indentation for replicating said first indentation as a second indentation (217b) on a surface of said silicon layer, out-diffusing dopants from said first region into said silicon layer for forming a buried region (217c) in said silicon layer extending towards said second indentation (217b), and forming a gate electrode structure (212) on said silicon layer surface in spatial relation with said buried region.

2. A method according to claim 1 wherein said step of forming said first indentation comprises thermally growing a layer (221) of silicon dioxide on and into said first side of said substrate, the thickness of said silicon dioxide layer overlying said first region (217) being greater than the thickness of said silicon dioxide layer overlying other portions of said substrate first side and thus forming a silicon dioxide plug (221a) extending inwardly of said substrate at said first region, and removing said silicon dioxide layer including said inwardly extending plug.

3. A method according to claim 1 wherein said gate electrode structure step comprises providing a gate electrode overlying said silicon layer and said second indentation therein and aligned with respect to said buried region.

4. method according to claim 3 including providing a second region (220a) within said silicon layer (224) forming a p-n junction (242) with said silicon layer, said p-n junction being spaced from said buried region (217c) in said silicon layer a distance in excess of a maximum spread of a depletion region (243) from said p-n junction towards said buried region occurring, during use of the device, at the on-set of avalanching at said p-n junction.

5. A method according to claim 4 including providing said second region (220a) at a spacing (T) from the interface (214a) of said silicon layer (224) with said substrate (224a) less than said spacing (S) between said p-n junction and said buried region.

* * * * *